United States Patent
Ishikawa et al.

(10) Patent No.: US 9,530,680 B2
(45) Date of Patent: Dec. 27, 2016

(54) METHOD OF FABRICATING SEMICONDUCTOR PACKAGE, SEMICONDUCTOR CHIP SUPPORTING CARRIER AND CHIP MOUNTING DEVICE

(71) Applicant: PANASONIC INTELLECTUAL PROPERTY MANAGEMENT CO., LTD., Osaka (JP)

(72) Inventors: Takatoshi Ishikawa, Yamanashi (JP); Tetsuhiro Kiryu, Yamanashi (JP); Takashi Nakamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/437,404

(22) PCT Filed: Mar. 14, 2014

(86) PCT No.: PCT/JP2014/001475
§ 371 (c)(1),
(2) Date: Apr. 21, 2015

(87) PCT Pub. No.: WO2014/156035
PCT Pub. Date: Oct. 2, 2014

(65) Prior Publication Data
US 2016/0005634 A1    Jan. 7, 2016

(30) Foreign Application Priority Data
Mar. 26, 2013 (JP) .................. 2013-063464

(51) Int. Cl.
*H01L 21/56* (2006.01)
*H01L 21/683* (2006.01)
(Continued)

(52) U.S. Cl.
CPC ......... *H01L 21/6835* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 6,130,473 A * 10/2000 Mostafazadeh ....... H01L 21/561
257/666
6,253,758 B1 * 7/2001 Wark ................... B28D 5/0094
125/12
(Continued)

FOREIGN PATENT DOCUMENTS

JP    2001-332649 A    11/2001
JP    2006-019363 A    1/2006
(Continued)

OTHER PUBLICATIONS

International Search Report for Application No. PCT/JP2014/001475 dated May 20, 2014.

*Primary Examiner* — Evren Seven
*Assistant Examiner* — Alia Sabur
(74) *Attorney, Agent, or Firm* — Pearne & Gordon LLP

(57) ABSTRACT

In fabricating semiconductor packages, a first supporting unit is supported by a supporting substrate with one surface of an adhesive sheet directed upward, the first supporting unit being constituted by attaching the adhesive sheet having an adhesive layer as the one surface thereof and a non-adhesive layer as the other surface thereof to a frame member; semiconductor chips are mounted on the one surface of the adhesive sheet; on the adhesive sheet, a resin portion containing the semiconductor chips is formed by resin-sealing the semiconductor chips; the first supporting unit is removed from the second supporting unit; the resin
(Continued)

portion is stripped from the adhesive sheet; external connection members are formed at the semiconductor chips contained in the resin portion; and portions between the respective semiconductor chips contained in the resin portion are cut to obtain individual semiconductor packages.

8 Claims, 10 Drawing Sheets

(51) Int. Cl.
    *H01L 23/00*     (2006.01)
    *H01L 21/67*     (2006.01)
    *H01L 21/78*     (2006.01)
    *H01L 23/31*     (2006.01)

(52) U.S. Cl.
    CPC .... *H01L 21/67132* (2013.01); *H01L 21/6838* (2013.01); *H01L 21/78* (2013.01); *H01L 24/19* (2013.01); *H01L 24/75* (2013.01); *H01L 24/96* (2013.01); *H01L 21/565* (2013.01); *H01L 23/3128* (2013.01); *H01L 2221/68318* (2013.01); *H01L 2221/68327* (2013.01); *H01L 2221/68381* (2013.01); *H01L 2224/12105* (2013.01); *H01L 2924/181* (2013.01)

(56) References Cited

U.S. PATENT DOCUMENTS

| | | | |
|---|---|---|---|
| 2001/0045625 A1 | 11/2001 | Sakamoto et al. | |
| 2002/0177875 A1* | 11/2002 | Tsui | A61B 17/0218 606/206 |
| 2003/0207498 A1* | 11/2003 | Islam | H01L 23/3114 438/120 |
| 2005/0003635 A1* | 1/2005 | Takekoshi | B28D 5/0082 438/464 |
| 2005/0176171 A1 | 8/2005 | Miyaki et al. | |
| 2010/0009519 A1* | 1/2010 | Seddon | H01L 21/6836 438/464 |
| 2010/0184256 A1* | 7/2010 | Chino | H01L 21/561 438/118 |
| 2011/0151625 A1 | 6/2011 | Hoshino et al. | |
| 2014/0004658 A1* | 1/2014 | Priewasser | H01L 21/56 438/118 |

FOREIGN PATENT DOCUMENTS

| | | |
|---|---|---|
| JP | 2011-134811 A | 7/2011 |
| JP | 2012-009476 A | 1/2012 |
| JP | 2012-109306 A | 6/2012 |
| WO | 03/085726 A1 | 10/2003 |
| WO | 2010/058646 A1 | 5/2010 |

* cited by examiner

METHOD OF FABRICATING SEMICONDUCTOR PACKAGE, SEMICONDUCTOR CHIP SUPPORTING CARRIER AND CHIP MOUNTING DEVICE

TECHNICAL FIELD

The present invention relates to a method of fabricating semiconductor packages each containing semiconductor chips, a semiconductor chip supporting carrier used in the semiconductor package fabricating method, and a chip mounting device used in the semiconductor package fabricating method.

BACKGROUND ART

In recent years, according to the high functionalization and the thinning of electronic devices such as portable-type information terminals or mobile phones, a miniaturized package called a CSP (Chip Size Package) is used also as a semiconductor package contained in the electronic device. Further, in recent years, an eWLP (Embedded Wafer Level Packaging) has been noticed as the process of fabricating the CSP, and this packaging has already been employed in the fabrication of some of the CSPs (see patent literatures 1 and 2, for example).

In the case of fabricating semiconductor packages according to the eWLP, it is necessary to use a substrate (supporting substrate) for supporting semiconductor chips from underneath thereof in the fabrication process. To this end, according to the fabricating method of the patent literature 1, an adhesive sheet having an adhesive layer on each of the both surfaces thereof is pasted on a substrate, and a plurality of semiconductor chips are mounted on the upper surface of the adhesive sheet. Next, the plurality of semiconductor chips on the adhesive sheet are collectively sealed by resin to thereby complete a resin portion containing the semiconductor chips. Next, the adhesive sheet is heated to expand the adhesive layer, whereby an adhesive force between the substrate and the adhesive layer is reduced and then the adhesive sheet and the substrate are separated. Then, the resin portion is stripped from the adhesive sheet and wiring layers etc. are formed on the surfaces of the semiconductor chips thus exposed. Thereafter, the resin portion is cut out to thereby dice the chips. According to the fabricating method of the patent literature 2, as a method of separating an adhesive sheet and a substrate, there is also proposed a method of constituting the substrate by copper and removing the substrate according to an etching process using ferric chloride aqueous solution etc.

PRIOR ART LITERATURES

Patent Literatures

Patent Literature 1: JP-A-2011-134811
Patent Literature 2: JP-A-2012-109306

SUMMARY OF INVENTION

Technical Problem

Since the surface of the semiconductor chips contacting with the adhesive sheet acts as a function surface on which members for external connection are formed, it is necessary to take great care at the time of separating the substrate and the adhesive sheet in order to prevent the breakage of the function surface. To this end, in the related art, the breakage of the function surface is prevented by suppressing a stress applied to the semiconductor chips in a manner that the adhesive sheet is stripped while deforming the substrate. However, since the substrate is required to have hardness of a constant level or more at the time of mounting the semiconductor chips and performing the resin-sealing etc., metal material such as SUS is used for the substrate. Thus, since the substrate deforms hardly, it is quite difficult to separate the substrate and the adhesive sheet according to the methods described above.

In this respect, according to the method described in the patent literature 1, the separation between the substrate and the adhesive sheet is facilitated by heating the adhesive sheet to thereby reduce the adhesive force between the substrate and the adhesive layer. However, the substrate and the adhesive layer still remain in an adhered state due to a constant adhesive force. Further, since the resin portion formed on the adhesive sheet is quite thin, the function surface of the semiconductor chips may receive a constant stress at the time of separating the substrate and the adhesive sheet. Further, according to the method described in the patent literature 2, the components contained in the etching solution may adversely affect the semiconductor chips. According to the aforesaid reasons, the method of separating the substrate and the adhesive sheet described in each of the patent literatures 1 and 2 is far from an excellent method in view of the protection of the semiconductor chips.

Accordingly, the invention is intended to provide a method of fabricating semiconductor packages which can easily separate a supporting substrate and an adhesive sheet while preventing the breakage of semiconductor chips, and also provide a semiconductor chip supporting carrier used in the semiconductor package fabricating method and a chip mounting device used in the semiconductor package fabricating method.

A method of fabricating semiconductor packages according to the invention, includes: a first supporting unit supporting step of supporting a first supporting unit by a supporting substrate constituting a second supporting unit in a state of directing one surface of an adhesive sheet upward, the first supporting unit being constituted by attaching the adhesive sheet having an adhesive layer as the one surface thereof and a non-adhesive layer as the other surface thereof to a frame member; a chip mounting step of mounting a plurality of semiconductor chips on the one surface of the adhesive sheet; a resin portion forming step of forming, on the adhesive sheet, a resin portion containing the plurality of semiconductor chips by resin-sealing the plurality of semiconductor chips; a first supporting unit removing step of removing the first supporting unit in which the resin portion is formed on the adhesive sheet, from the second supporting unit; a sheet stripping step of stripping the resin portion from the adhesive sheet; an external connection member forming step of forming external connection members at the plurality of semiconductor chips contained in the resin portion; and a semiconductor package obtaining step of cutting portions between the respective semiconductor chips contained in the resin portion to obtain individual semiconductor packages.

A semiconductor chip supporting carrier according to the invention is used in the above described semiconductor package fabricating method, and includes: the first supporting unit which is configured by attaching the adhesive sheet, having the adhesive layer as the one surface thereof and the non-adhesive layer as the other surface thereof, to the frame member; and the second supporting unit which includes the supporting substrate for supporting the first supporting unit in the state of directing the one surface upward.

A chip mounting device according to the invention is used in the above described semiconductor package fabricating method and includes: a stage which holds a semiconductor chip supporting carrier that is configured by the first supporting unit and the second supporting unit, the first supporting unit being configured by attaching the adhesive sheet having the adhesive layer as one surface thereof and the non-adhesive layer as the other surface thereof to the frame member, and the second supporting unit including the supporting substrate for supporting the first supporting unit in the state of directing the one surface upward; a suction unit which sucks the first supporting unit and the second supporting unit held by the stage from underneath; and a mounting head which mounts semiconductor chips on the one surface of the adhesive sheet.

Effects of Invention

According to the invention, a first supporting unit, constituted by attaching an adhesive sheet having an adhesive layer as one surface thereof and a non-adhesive layer as the other surface thereof to a frame member, is supported by a supporting substrate constituting a second supporting unit in a state of directing the one surface upward; a plurality of semiconductor chips are mounted on the one surface of the adhesive sheet; a resin portion containing the plurality of semiconductor chips is formed on the adhesive sheet by resin-sealing the plurality of semiconductor chips; the first supporting unit in which the resin portion is formed on the adhesive sheet is removed from the second supporting unit; the resin portion is stripped from the adhesive sheet; external connection members are formed at the plurality of semiconductor chips contained in the resin portion; and portions between the respective semiconductor chips contained in the resin portion are cut to obtain individual semiconductor packages. Thus, the supporting substrate and the adhesive sheet used in the fabricating process of the semiconductor packages can be separated easily while preventing the breakage of the semiconductor chips. Accordingly, the semiconductor packages can be fabricated easily.

MODES FOR CARRYING OUT THE INVENTION

Hereinafter, the explanation will be made with reference to drawings as to a method of fabricating semiconductor packages, and a semiconductor chip supporting carrier and a chip mounting device each used in the method. A semiconductor package fabricated in this embodiment is manufactured using the eWLP and configured by a mold body, for sealing a semiconductor chip cut out from a semiconductor wafer, a rewiring layer and bumps for external connection. For the fabrication of the semiconductor package having such the configuration, the semiconductor chip supporting carrier, the chip mounting device and a molding device explained below are used.

Figure 1:
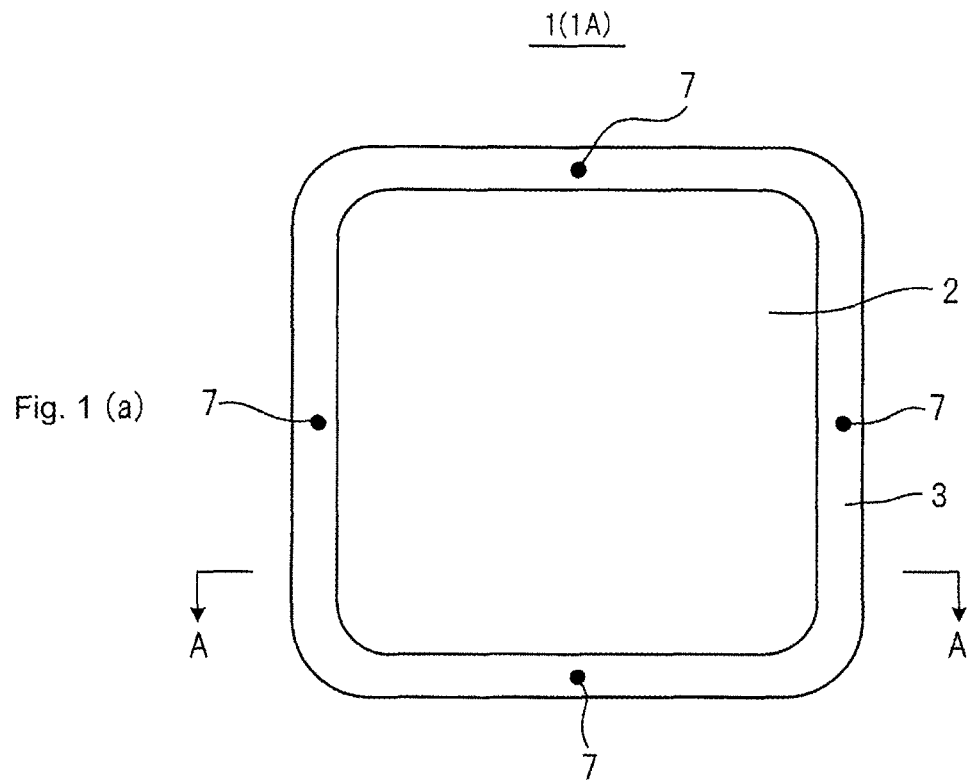
FIG.1 (*a*) is a plan view of a first supporting unit used in a semiconductor package fabricating method according to an embodiment of the invention, FIG.1 (*b*) is a sectional view of the first supporting unit used in the semiconductor package fabricating method according to the embodiment of the invention, and FIG.1 (*c*) is a partially enlarged sectional view of the first supporting unit used in the semiconductor package fabricating method according to the embodiment of the invention.
Figure 1:
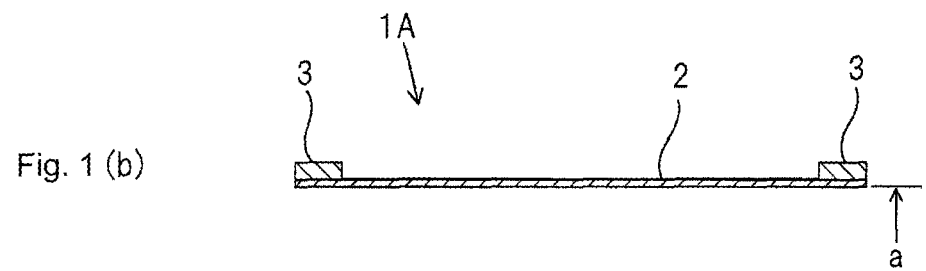
Figure 1:
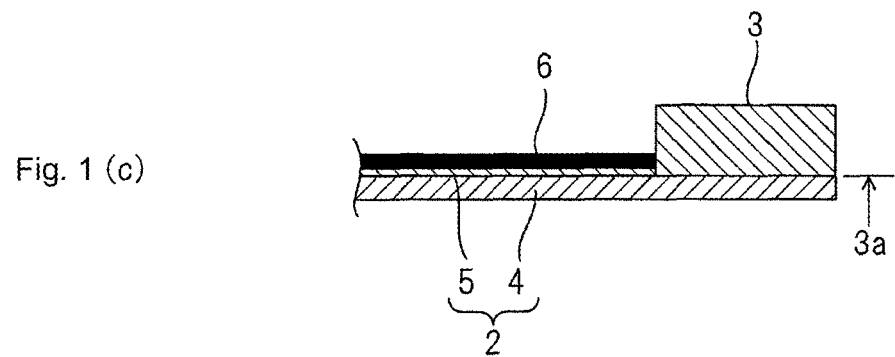
Figure 2:
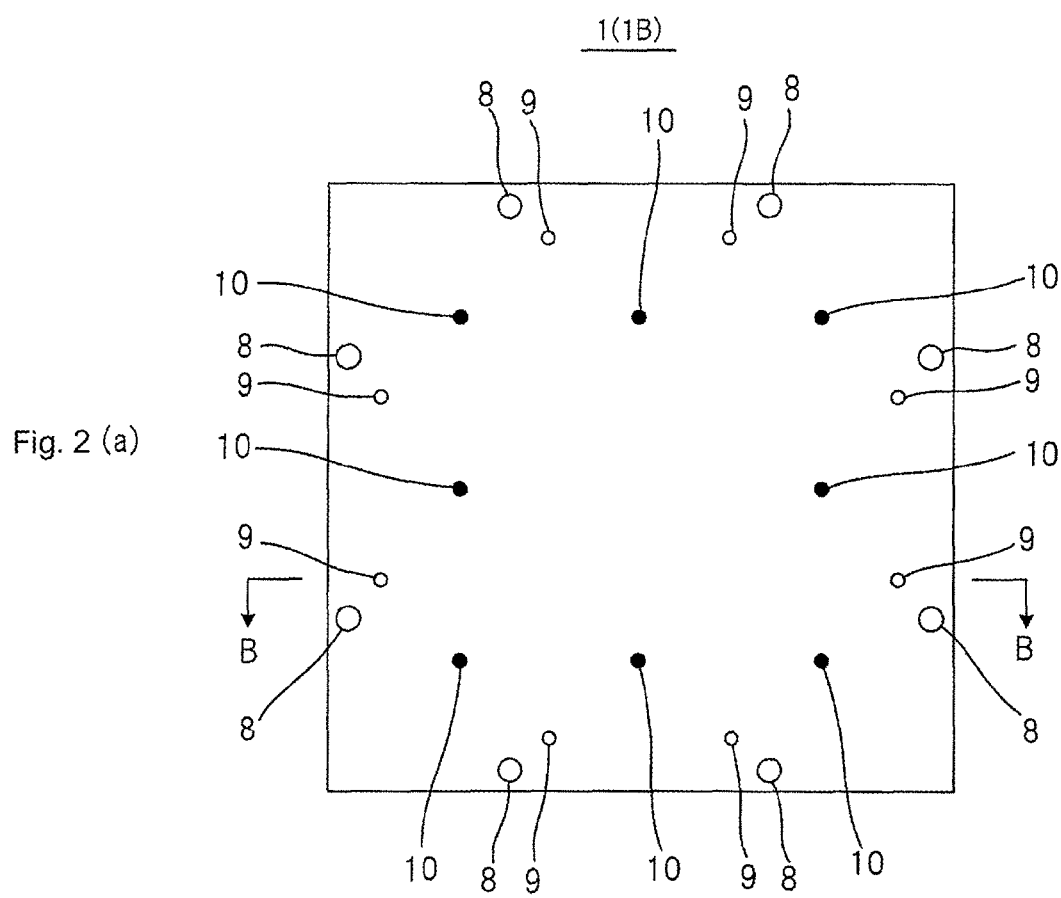
FIG. 2 (*a*) is a plan view of a second supporting unit used in the fabrication of the semiconductor packages according to the embodiment of the invention, and FIG. 2 (*b*) is a sectional view of the second supporting unit used in the fabrication of the semiconductor packages according to the embodiment of the invention.
Figure 2:
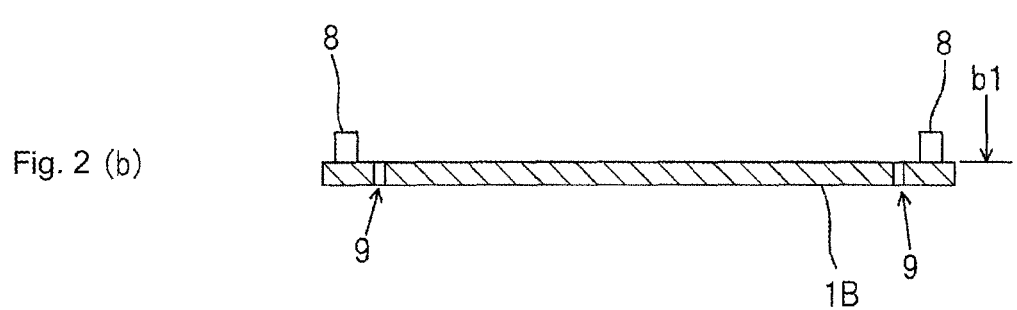
Figure 3:
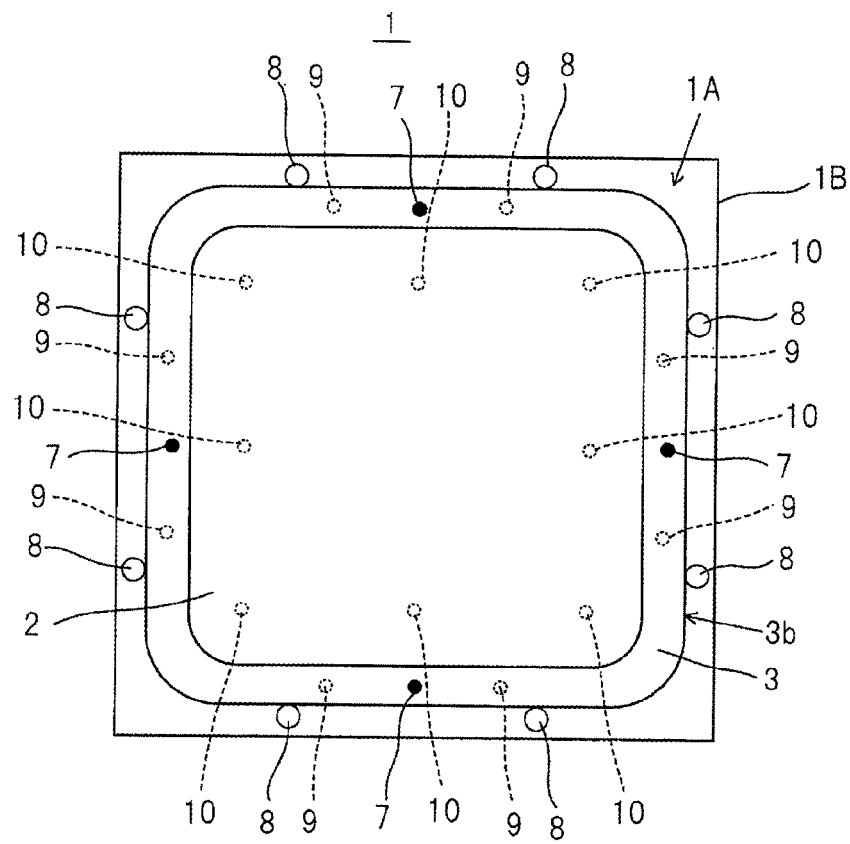
FIG. 3 (*a*) is a plan view of a semiconductor chip supporting carrier used in the fabrication of the semiconductor packages according to the embodiment of the invention, and FIG. 3 (*b*) is a sectional view of the semiconductor chip supporting carrier used in the fabrication of the semiconductor packages according to the embodiment of the invention.
Figure 3:
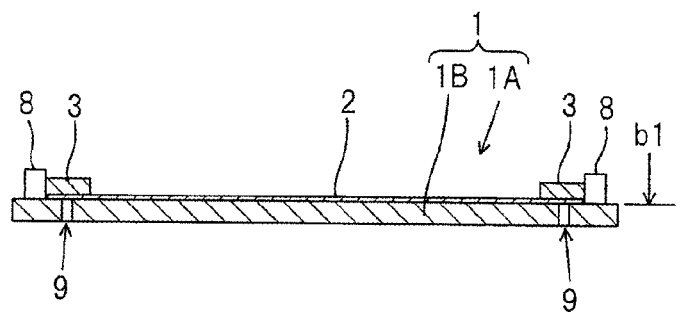
Figure 4:
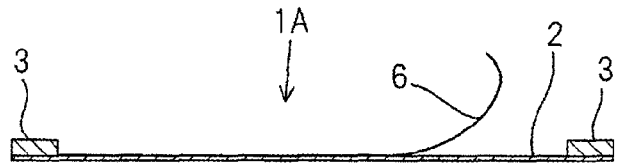
FIG. 4 (*a*), FIG. 4 (*b*) and FIG. 4 (*c*) are sectional views showing the fabrication process of the semiconductor packages according to the embodiment of the invention.
Figure 4:
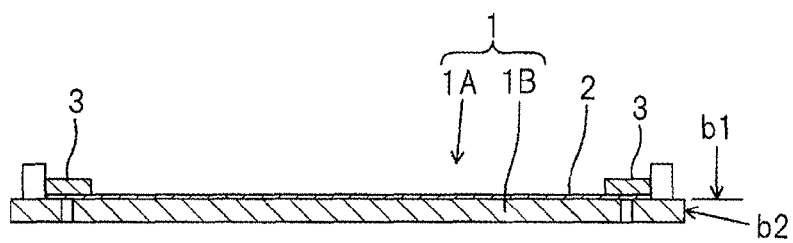
Figure 4:
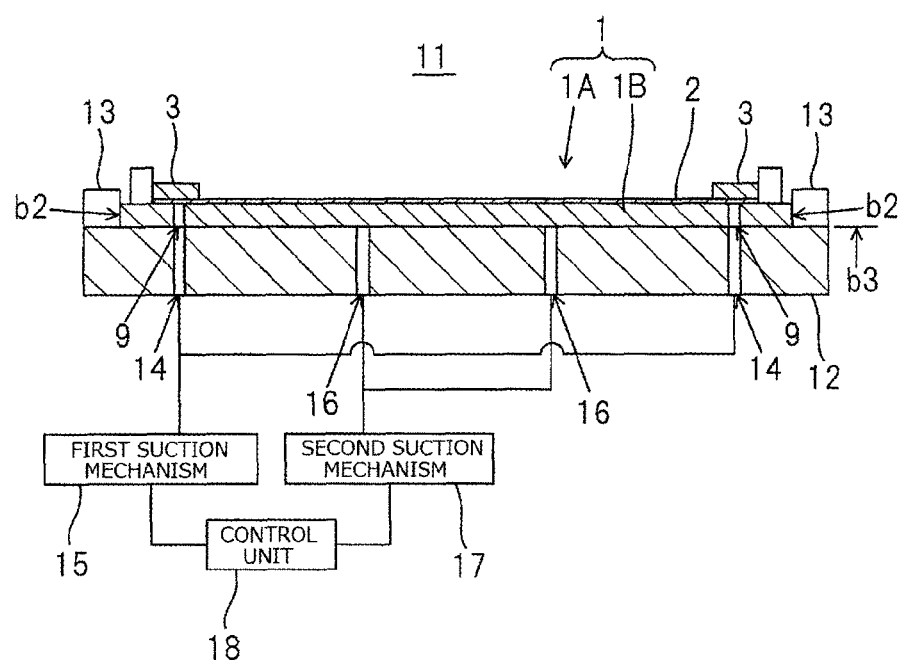
Figure 5:
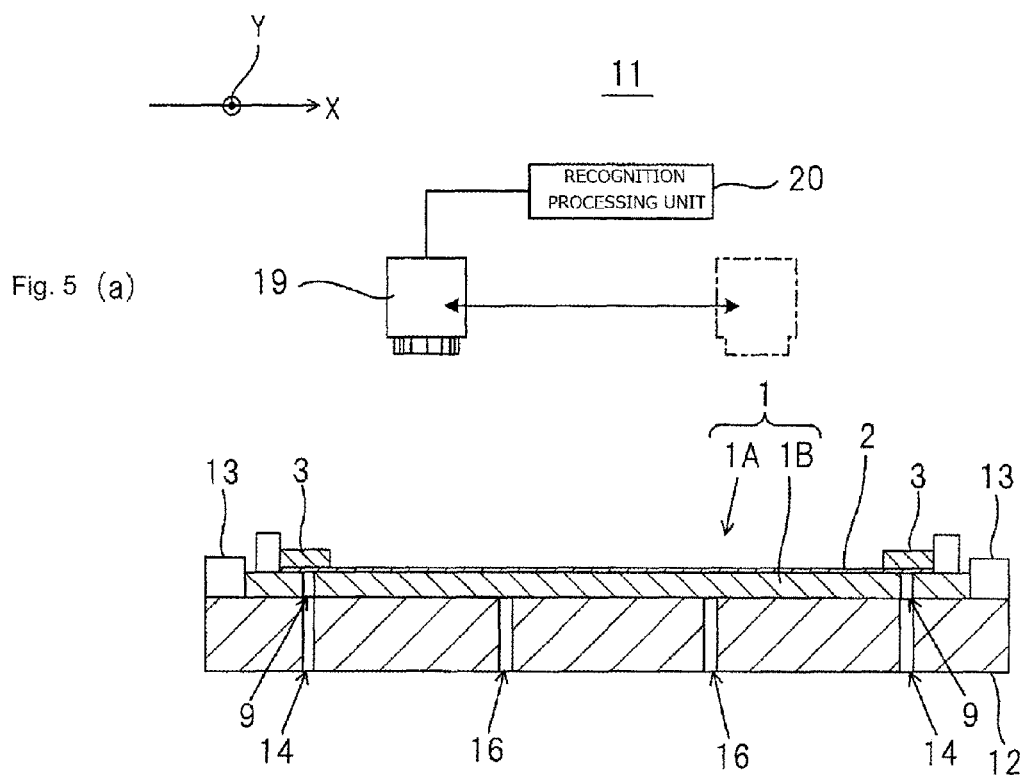
FIG. 5 (*a*) and FIG. 5 (*b*) are sectional views showing the fabrication process of the semiconductor packages according to the embodiment of the invention.
Figure 5:
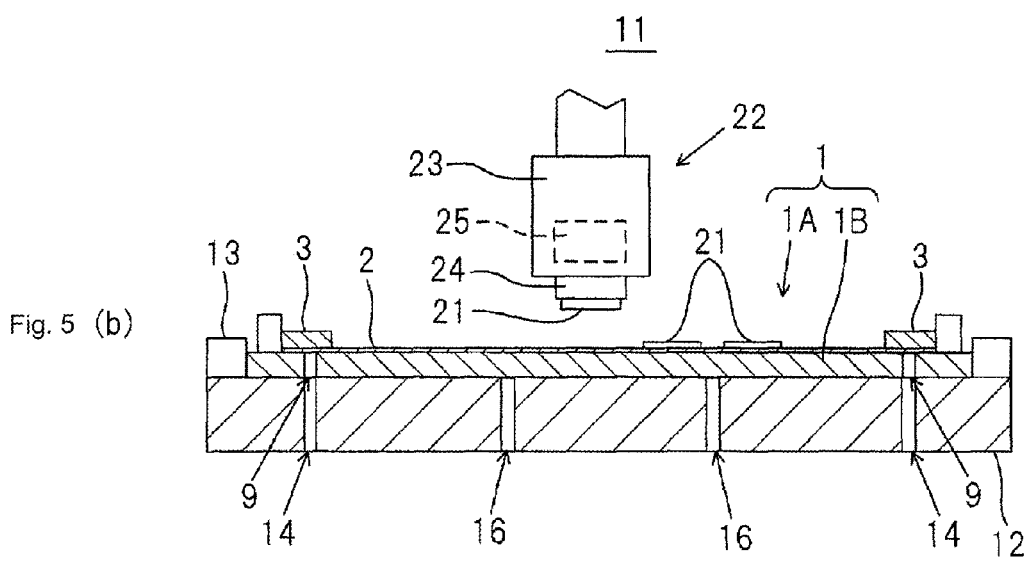

Next, the explanation will be made as to the semiconductor chip supporting carrier 1 with reference to FIG. 1 (*a*) to (*c*), FIGS. 2 (*a*) and (*b*) and FIGS. 3(*a*) and (*b*). The semiconductor chip supporting carrier 1 is a tool for supporting semiconductor chips 21 (FIG. 5(*b*)) in the fabricating process of the semiconductor packages. The semiconductor chip supporting carrier is configured by an adhesive carrier sheet 1A shown in FIG. 1 (*a*) to (*c*) and a supporting substrate 1B shown in FIGS. 2 (*a*) and (*b*). FIG. 1(*b*) is a sectional diagram of the adhesive carrier sheet 1A cut along a line A-A in FIG. 1(*a*), and FIG. 2(*b*) is a sectional diagram of the supporting substrate 1B cut along a line B-B in FIG. 2(*a*).

In FIGS. 1 (*a*) and (*b*), the adhesive carrier sheet 1A is configured by attaching an annular frame member 3 on the upper surface of an adhesive sheet 2. In FIG. 1(*c*), the adhesive sheet 2 has a two-layered structure consisting of a transparent base material 4 as a non-adhesive layer made of silicon resin etc. and a transparent adhesive layer 5 formed on the upper surface of the base material. A protection film 6 for preventing the deterioration of the adhesive layer 5 is pasted on the upper surface of the adhesive layer 5. The protection film 6 is stripped from the adhesive sheet 2 at the time of fabricating the semiconductor packages. The one surface of the adhesive sheet 2, on which the adhesive layer 5 is formed, acts as a chip holding surface for holding the semiconductor chips 21. Each of the base material 4 and the adhesive layer 5 need have certain degrees of transparency.

In FIGS. 1(b) and 1(c), the frame member 3 is attached to the base material 4 in a state that the lower surface 3a of the frame member surrounds the adhesive layer 5 and the protection film 6 on the each side thereof along the outer circumferential edge of the base material. The frame member 3 is used as a holding part held by a worker at the time of performing a predetermined operation such as carrying of the adhesive sheet 2. A plurality of first reference marks 7 (one at every side, that is, four in total in this embodiment) are formed at predetermined positions of the upper surface of the frame member 3 in a plan view. In the aforesaid configuration, the adhesive carrier sheet 1A acts as a first supporting unit which is configured by attaching the adhesive sheet 2, having the adhesive layer 5 as the one surface thereof and the non-adhesive layer (base material 4) as the other surface thereof, to the frame member 3.

In FIGS. 2(a) and 2(b), the supporting substrate 1B is formed by molding metal material such as SUS into a rectangular shape, and has a flat upper surface b1 capable of supporting, from underneath, the lower surface a (FIG. 1(b)) of the adhesive carrier sheet 1A which is in a state of directing the one surface (surface at which the adhesive layer 5 is formed) thereof upward. The area of the supporting substrate 1B is designed so as to be larger than the area of the adhesive carrier sheet 1A. That is, the supporting substrate 1B serves as a second supporting unit for supporting the adhesive carrier sheet 1A in the state of directing the one surface thereof upward. The upper surface b1 of the supporting substrate 1B acts as a non-adhesive surface on which adhesive material is not pasted.

In the edge portion of the upper surface b1 of the supporting substrate 1B, a plurality of positioning pins 8 (two in this embodiment) are erected at every side of the supporting substrate. In the case of placing the adhesive carrier sheet 1A on the supporting substrate 1B, as shown in FIGS. 3(a) and 3(b), the adhesive carrier sheet 1A is lowered toward the supporting substrate 1B while sliding portions of the side surface 3b of the outer periphery of the frame member 3 along the respective positioning pins 8 to thereby land the base material 4 acting as the non-adhesive layer on the upper surface b1 of the supporting substrate 1B. Thus, the adhesive carrier sheet 1A is supported on the supporting substrate 1B in a state that the portions of the side surface 3b of the outer periphery of the frame member 3 abut against the positioning pins 8, whereby the adhesive carrier sheet is restricted in its movement toward the horizontal direction. In this manner, the positioning pins 8 act as a positioning unit for positioning the adhesive carrier sheet 1A at the predetermined position on the supporting substrate 1B. Each of the number and the erecting positions of the positioning pins 8 is arbitrary.

In FIGS. 3(a) and 3(b), in a state that the supporting substrate 1B supports the adhesive carrier sheet 1A, a plurality of suction paths 9 (eight in this embodiment) each penetrating the supporting substrate in the vertical direction are formed at predetermined positions of the supporting substrate 1B contacting with the adhesive sheet 2 (base material 4) located at the lower side of the frame member 3 (see also FIG. 2(a)). Further, in the state that the supporting substrate 1B supports the adhesive carrier sheet 1A, a plurality of second reference marks (reference marks) 10 (eight in this embodiment) are formed at predetermined positions of the upper surface 1b of the supporting substrate 1B surrounded by the frame member 3. Since each of the base material 4 and the adhesive layer 5 constituting the adhesive sheet 2 is transparent, the second reference marks 10 can be recognized via the adhesive sheet 2 from the upper direction. The first reference marks 7 and the second reference marks 10 are used for calculating the mounting positions of the semiconductor chips 21 as described later.

The semiconductor chip supporting carrier 1 is configured in the aforesaid manner. Next, the explanation will be made with reference to FIG. 4(a) to FIG. 9(b) as to the method of fabricating the semiconductor packages using the semiconductor chip supporting carrier 1. Hereinafter, one direction on the horizontal surface will be referred to as an X direction and another direction orthogonal to the X direction on the horizontal surface will be referred to as a Y direction.

First, the adhesive carrier sheet 1A and the supporting substrate 1B are prepared (ST1: process of preparing the first and second supporting units). Then, as shown in FIG. 4(a), the protection film 6 pasted on the adhesive sheet 2 is stripped to thereby expose the adhesive layer 5. Then, as shown in FIG. 4(b), the adhesive carrier sheet 1A is placed on the upper surface b1 of the supporting substrate 1B in a state that the adhesive layer 5 is directed upward to thereby support the adhesive carrier sheet 1A by the supporting substrate 1B (ST2: process of supporting the first supporting unit).

Thereafter, a process of mounting the semiconductor chip 21 on the adhesive sheet 2 is performed by using a chip mounting device 11 shown in FIG. 4(c). First, the semiconductor chip supporting carrier 1 configured to support the adhesive carrier sheet 1A by the supporting substrate 1B is rendered to be supported by the upper surface of a stage 12 provided at the chip mounting device 11 (ST3: process of placing on the first stage).

The holding state of the semiconductor chip supporting carrier 1 by the stage 12 will be explained in detail with reference to FIG. 4(c). Abutting members 13 acting as positioning parts are provided at both end portions of the upper surface of the stage 12. The semiconductor chip supporting carrier 1 is lowered and placed on the stage 12 while sliding the side surface b2 of the supporting substrate 1B along the inner side surfaces of the abutting members 13. The stage 12 contains a heater (not shown) to thereby heat the adhesive sheet 2 held by the stage 12 at a predetermined temperature.

The stage 12 is provided with a plurality of first suction paths 14, each penetrating the stage in the vertical direction, at positions communicating with the corresponding suction paths 9 of the supporting substrate 1B, respectively. Each of the first suction paths 14 also communicates with a first suction mechanism 15. A control unit 18, provided in the chip mounting device 11 and having an arithmetic processing function, controls the first suction mechanism 15 to thereby suck the adhesive sheet 2 supported by the supporting substrate 1B from the lower direction via the suction paths 9 and the first suction paths 14.

Further, the stage 12 is provided with a plurality of second suction paths 16, each penetrating the stage in the vertical direction, at inner positions than the first suction paths 14. The open end at the upper portion of each of the second suction paths 16 contacts with a portion of the lower surface b3 of the supporting substrate 1B in a state that the semiconductor chip supporting carrier 1 is held by the stage 12. Each of the second suction paths 16 communicates with a second suction mechanism 17. The control unit 18 controls the second suction mechanism 17 to thereby suck the supporting substrate 1B from the lower direction via the second suction paths 16.

In the aforesaid configuration, the first suction paths 14, the second suction paths 16, the first suction mechanism 15 and the second suction mechanism 17 act as a suction unit for sucking, from the lower direction, the first supporting unit (adhesive carrier sheet 1A) and the second supporting unit (supporting substrate 1B) held by the stage 12. The sucking of the first supporting unit by the suction unit is performed via the suction paths 9 formed in the second supporting unit. Since the adhesive carrier sheet 1A and the supporting substrate 1B are sucked from the lower direction by the suction unit as explained above, these respective members can be fixed to the stage 12.

After holding the semiconductor chip supporting carrier 1 by the stage 12, a camera 19 acting as an imaging unit images the second reference marks 10 as shown in FIG. 5(a) (ST4: reference mark imaging process). The camera 19 can be moved horizontally in the X and Y directions by a camera moving mechanism (not shown), whereby all the second reference marks 10 can be imaged. Image data thus obtained is subjected to a recognition processing by a recognition processing unit 20. The mounting position of each of the semiconductor chips 21 to be mounted on the adhesive sheet 2 are obtained based on the result of the recognition processing. That is, the camera 19 and the recognition processing unit 20 act as a reference mark recognition unit for recognizing the second reference marks 10 formed on the supporting substrate 1B.

In the case where the second reference marks 10 cannot be recognized due to the employment of the adhesive sheet 2 having low transparency, the camera 19 images the first reference marks 7 formed at the frame member 3, thereby obtaining the mounting position of each of the semiconductor chips 21 based on image data thus obtained. Even in the case where the second reference marks 10 can be recognized, the mounting positions may be obtained by recognizing the first reference marks 7. Alternatively, the mounting positions may be obtained by recognizing both the first reference marks 7 and the second reference marks 10.

Next, the semiconductor chips 21 (hereinafter merely referred to as "chips") are mounted by using a mounting head 22 provided at the chip mounting device 11 shown in FIG. 5(b). Before the explanation of this operation, the configuration of the mounting head 22 will be explained. The mounting head 22 has a function of mounting the chips 21 on the one surface of the adhesive sheet 2 and moves in the X and Y directions by a head moving mechanism (not shown).

A holding tool 24 is attached to the mounting head 22 via a tool holder 23 so as to be movable in the vertical direction. Suction holes are provided at the lower surface of the holding tool 24, whereby the chip 21 can be sucked and held by controlling a suction mechanism communicating with these suction holes. The tool holder 23 contains a heater 25 so as to heat the chip 21 held by the holding tool 24. The respective portions such as the mounting head 22 are controlled by the control unit 18.

Figure 6:
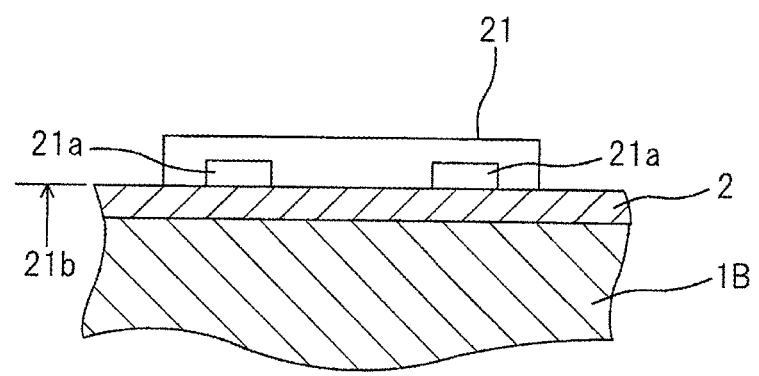
FIG. 6 is a partially sectional view showing the fabrication process of the semiconductor packages according to the embodiment of the invention.
Figure 7:
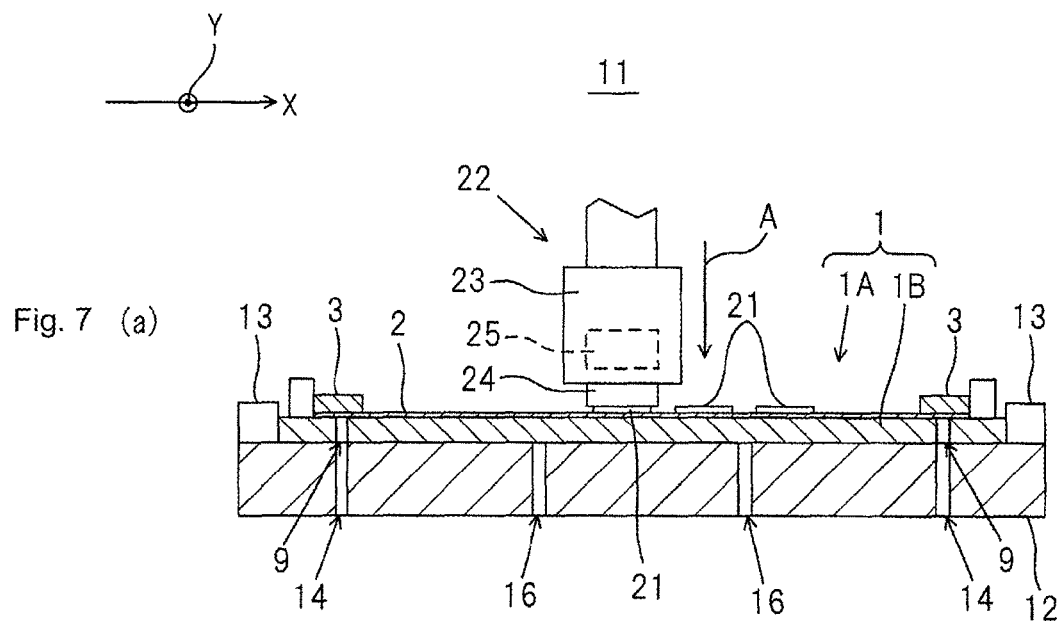
FIGS. 7 (*a*) and 7 (*b*) are sectional views showing the fabrication process of the semiconductor packages according to the embodiment of the invention.
Figure 7:
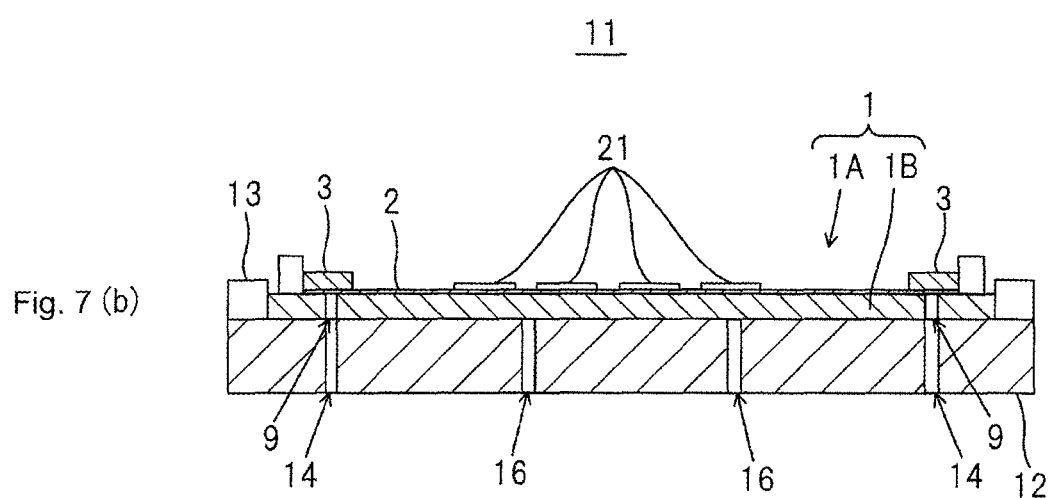

When the mounting position of the chip 21 is calculated in the preceding process, the control unit 18 moves the mounting head 22 to a chip supply position. At this position, the mounting head sucks and hold the chip 21. In this case, as shown in FIG. 6, the upper surface of the chip on the opposite side of the function surface 21b is sucked in a state that the function surface 21b, as one surface of the chip forming external connection terminals 21a thereon, is directed downward. Then, the control unit 18 moves the mounting head 22 holding the chip 21 to a position above the mounting position. At this time, the chip 21 is heated to a predetermined temperature by the heater 25.

Next, as shown in FIG. 7(a), the holding tool 24, holding the chip 21 in a state of being heated to the predetermined temperature, is lowered toward the adhesive sheet 2 (arrow A). Then, the lower surface (function surface 21b) of the chip 21 is pressed against the adhesive layer 5 for a constant time period. Thus, the chip 21 is thermocompression-bonded and mounted on the adhesive sheet 2. At this time, since the adhesive sheet 2 is supported from the lower direction by the supporting substrate 1B having a constant hardness, the chip 21 can be pressed surely.

Next, as shown in FIG. 7(b), the mounting head 22 is moved upward upon the lapse of the constant time period to thereby separate the chip 21 from the holding tool 24. Thus, a chip mounting operation is completed. This chip mounting operation explained above is repeatedly performed for a number of times equal to the number of the chips 21 to be mounted to the adhesive sheet 2. That is, in this case, a plurality of the chips 21 are mounted on the one surface of the adhesive sheet 2 (ST5: chip mounting process). Further, in this case, the chips 21 are mounted with reference to the second reference marks 10 or the first reference marks 7 recognized by the reference mark recognition unit. In this embodiment, sixteen chips 21 are mounted on the adhesive sheet 2 in a matrix pattern (FIG. 9(a)). Incidentally, the heater 25 is not always required to be provided in the tool holder 23, and the chips 21 may be bonded on the adhesive sheet 2 without being heated.

Figure 8:
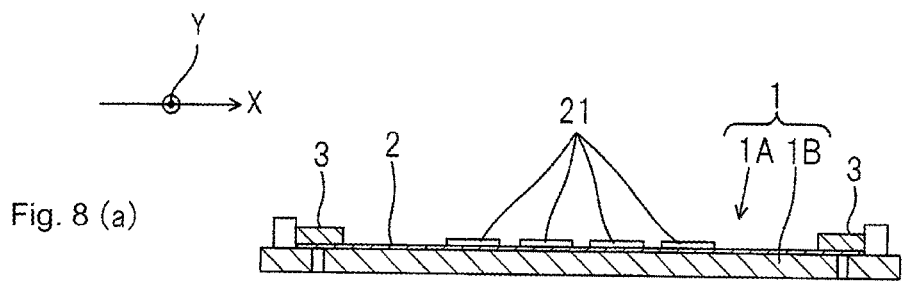
FIG. 8 (*a*), FIG. 8 (*b*) and FIG. 8 (*c*) are sectional views showing the fabrication process of the semiconductor packages according to the embodiment of the invention.
Figure 8:
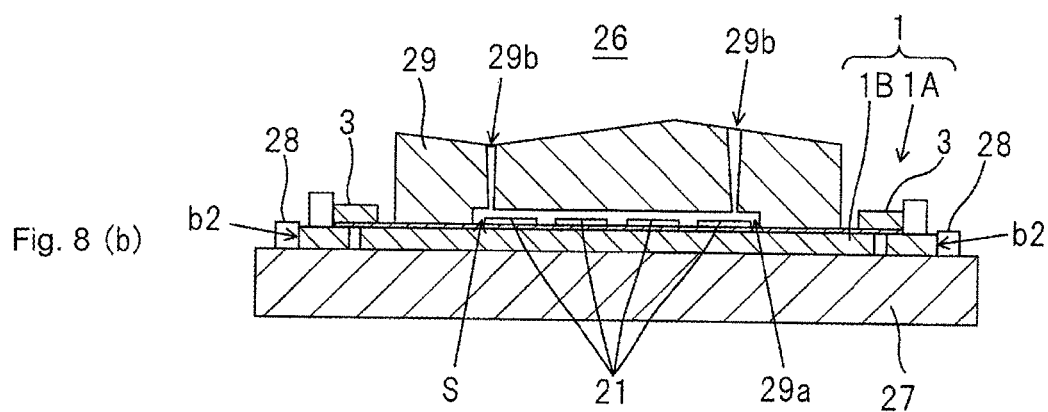
Figure 8:
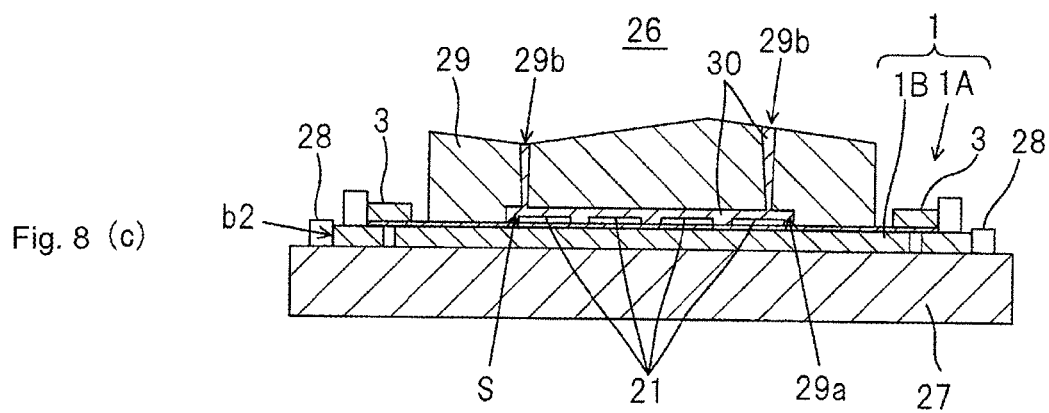
Figure 9:
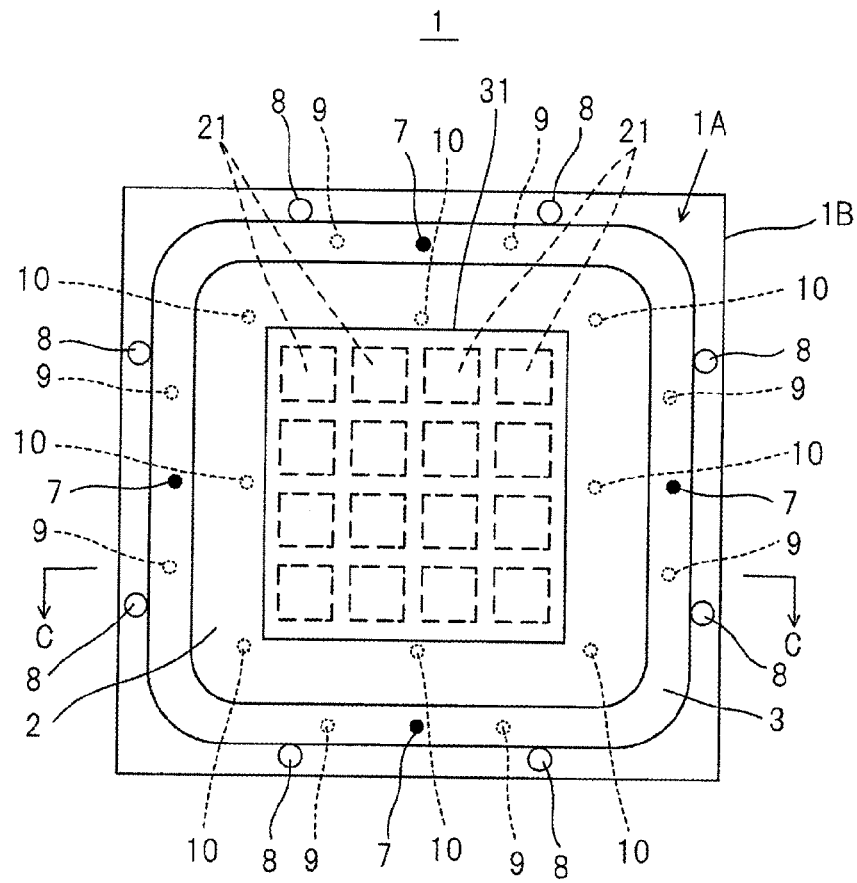
FIG. 9 (*a*) and FIG. 9 (*b*) are sectional views showing the fabrication process of the semiconductor packages according to the embodiment of the invention.
Figure 9:
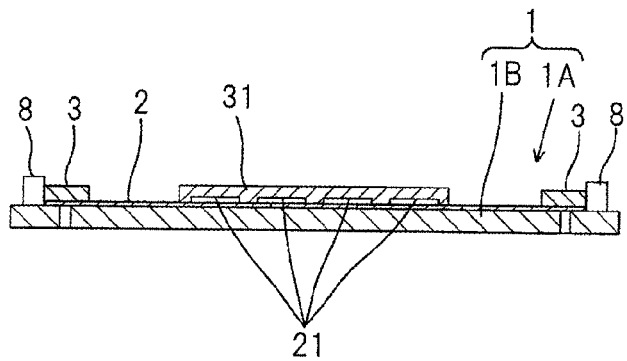

When the mounting operation of all the chips 21 is completed, a resin molding operation for sealing the plurality of chips 21 by resin using a molding device 26 shown in FIGS. 8 (b) and (c). First, the semiconductor chip supporting carrier 1 is taken out from the chip mounting device 11 (see FIG. 8(a)) and held on the upper surface of the stage 27 provided at the molding device 26 (ST6: process of holding on the second stage) (see FIG. 8(b)). Abutment members 28 serving as positioning portions are provided at the both ends of the upper surface of the stage 27. The semiconductor chip supporting carrier 1 is lowered and placed on the stage 27 while sliding the side surfaces b2 of the supporting substrate 1B along the inner side surfaces of the abutment members 28. Thus, the semiconductor chip supporting carrier 1 is positioned at a predetermined position on the stage 27.

Next, as shown in FIG. 8(b), a mold 29, having a concave portion 29a formed at the lower surface thereof, is lowered from the upper direction of the semiconductor chip supporting carrier 1 held by the stage 27, thereby confining the plurality of chips 21 within a space S formed by the concave portion 29a and the adhesive sheet 2. Next, as shown in FIG. 8(c), molten resin 30 is injected into communication paths 29b, which are formed in the mold 29 and communicate with the concave portion 29a at the upper portion thereof, and then filled within the space S. Then, the resin is left as it is for a predetermined time period until the resin 30 filled within the space S is hardened, and thereafter the mold 29 is moved upward. Thus, as shown in FIG. 9(a), a mold body 31 serving as a resin portion, which seals the plurality of chips 21 by the resin 30, is formed on the adhesive sheet 2. In other words, by resin-sealing the plurality of chips 21, the resin portion containing the plurality of chips 21 is formed on the adhesive sheet 2 (ST7: resin portion forming process). Incidentally, FIG. 9(b) is a sectional diagram cut along a line C-C in FIG. 9(a).

Figure 10:
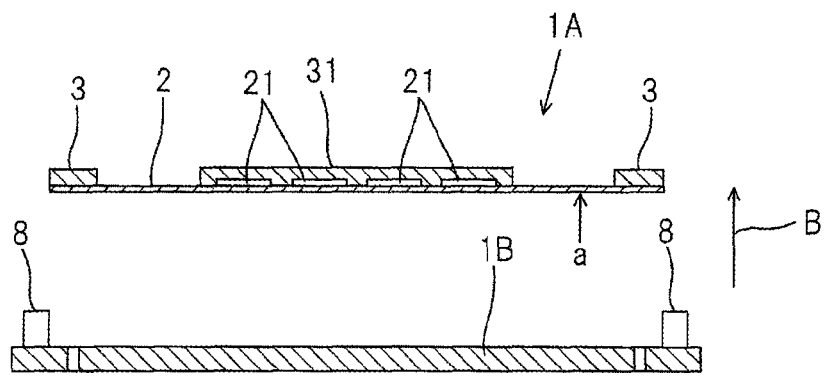
FIG. 10 (*a*), FIG. 10 (*b*), FIG. 10 (*c*) and FIG.10 (*d*) are sectional views showing the fabrication process of the semiconductor packages according to the embodiment of the invention.
Figure 10:
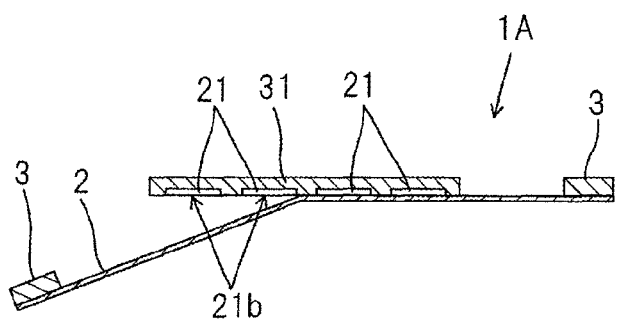
Figure 10:
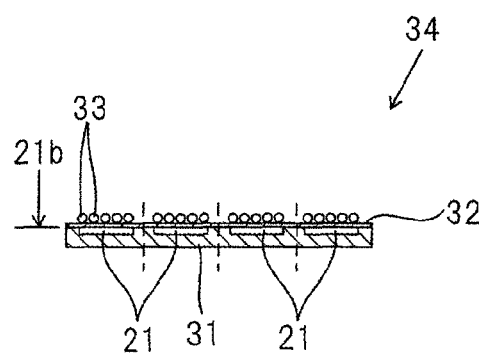
Figure 10:
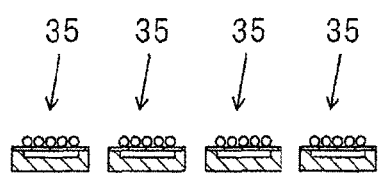

When the mold body 31 is formed, the semiconductor chip supporting carrier 1 is taken out from the molding device 26. Then, as shown in FIG. 10(a), a worker holds the frame member 3 and draws out the adhesive carrier sheet 1A upward with respect to the supporting substrate 1B to thereby separate them (arrow B). That is, in this case, the first supporting unit (adhesive carrier sheet 1A) forming the resin portion on the adhesive sheet 2 is removed from the second supporting unit (supporting substrate 1B) (ST8: first supporting unit removing process).

Since the base material 4 forming the lower surface a of the adhesive carrier sheet 1A is formed by the non-adhesive layer, when the supporting substrate 1B supports the adhesive carrier sheet 1A in a state of directing the base material 4 downward, the carrier sheet and the supporting substrate are not bonded. Thus, the adhesive carrier sheet 1A and the supporting substrate 1B can be easily separated without applying a stress to the function surface 21b of the chip 21 contacting to the adhesive layer 5 of the adhesive sheet 2. Accordingly, a problem of the related art, that the separation between the adhesive sheet and the supporting substrate 1B is difficult since the adhesive sheet having adhesive layers at the both surfaces thereof is pasted to a supporting body (corresponding to the supporting substrate 1B), can be solved.

After separating the adhesive carrier sheet 1A and the supporting substrate 1B, as shown in FIG. 10(b), a worker holds the frame member 3 and strips the mold body 31 from the adhesive sheet 2 (ST9: sheet stripping process). In this stripping process, since the supporting substrate 1B is already removed in the preceding process, the adhesive sheet can be easily stripped from the mold body 31 while easily bending the adhesive sheet 2. As a result, the mold body 31 and the adhesive carrier sheet 1A are separated and the function surface 21b of each of the chips 21 is placed in an exposed state.

Next, the rewiring layer 32 and the bumps 33 for external connection are formed on the function surface 21b of the chip 21 in the following manner. First, the mold body 31 is reversed to thereby direct the function surface 21b upward, and the rewiring layer 32 is formed on the function surface 21b. Then, the bumps 33 are formed on the rewiring layer 32 (see FIG. 10(c)). That is, in this case, members for external connection (rewiring layer 32 and bumps 33) are formed on the plurality of chips 21 contained in the resin portion (ST10: external connection members forming process). Thus, a semiconductor package component 34 before being diced individually is completed.

Next, the respective chips contained in the mold body 31 are cut along dotted lines between the adjacent chips 21, 21 shown in FIG. 10(c) by a cutting blade for dicing (not shown). Thus, the individual semiconductor packages 35 shown in FIG. 10(d) can be obtained. That is, in this case, the respective chips 21 contained in the resin portion are cut therebetween to thereby obtain individual semiconductor packages 35 (ST11: semiconductor package obtaining process). The semiconductor packages 35 are fabricated via the aforesaid processes.

As explained above, in the fabrication of semiconductor package components using the eWLP according to the related art, it is necessary to use a hard supporting member (supporting substrate 1B) for lower-receiving supporting, at the time of mounting the semiconductor chips on the adhesive sheet. In the related art, the adhesive tape having an adhesive layer on each of the both sides thereof is pasted on the upper surface of the supporting body, and the resin portion (mold body 31) containing the substrate chips is formed on the adhesive tape in the fabrication process. Thus, the stripping process between the supporting body and the resin portion is quite difficult and hence the breakage of the semiconductor chips occurs frequently at the time of the stripping.

In contrast, according to the invention, although the resin portion (mold body 31) containing the semiconductor chips 21 is formed on the adhesive sheet 2, the lower surface, which is the surface contacting to the supporting substrate 1B, of the adhesive sheet 2 is formed by the base material 4 as the non-adhesive layer. Thus, the sheet can be easily separated from the supporting substrate 1B by merely pulling out the adhesive sheet 2 upward and further the breakage of the semiconductor chips 21 can be prevented.

The invention is not limited to the embodiment explained above. For example, although each of the first reference mark 7 and the second reference mark 10 may be single, the number of each of the respective reference marks is desirably at least two in order to accurately calculate the mounting positions of the semiconductor chips 21. Further, a constituent element other than the positioning pin 8 may be used as the positioning unit. For example, a groove having a constant area equal to or larger than the area of the adhesive carrier sheet 1A may be formed at the upper surface b1 of the supporting substrate 1B and the adhesive carrier sheet 1A may be fit into this groove to thereby perform the positioning.

Although the invention is explained in detail with reference to the particular embodiment, it will be apparent for those skilled in the art that the embodiment can be changed and modified in various manners without departing from the spirit and scope of the invention.

The application is based on Japanese Patent Application (Japanese Patent Application No. 2013-063464) filed on Mar. 26, 2013, the content of which is incorporated herein by reference.

INDUSTRIAL APPLICABILITY

According to the invention, the supporting substrate and the adhesive sheet used in the fabricating process of the semiconductor packages can be separated easily while preventing the breakage of the semiconductor chips. Thus, the invention is useful in the field of fabricating the semiconductor packages using the eWLP.

REFERENCE SIGNS LIST 1 semiconductor chip supporting carrier
1A adhesive carrier sheet (first supporting unit)
1B supporting substrate (second supporting unit)
2 adhesive sheet
3 frame member
4 base material (non-adhesive layer)
5 adhesive layer
8 positioning pin (positioning unit)
9 suction path
10 reference mark
11 chip mounting device
12 stage
14 first suction path (suction unit)
15 first suction mechanism (suction unit)
16 second suction path (suction unit)
17 second suction mechanism (suction unit)
19 camera
20 recognition processing unit
21 semiconductor chip
22 mounting head
31 mold body (resin portion)
32 rewiring layer (external connection member)
33 bump (external connection member)
35 semiconductor package

The invention claimed is:

1. A method of fabricating semiconductor packages, comprising:
   a first supporting unit placing step of placing a first supporting unit comprising an adhesive layer and a non-adhesive layer on a second supporting unit so that the non-adhesive layer contacts with an upper surface of the second supporting unit without an adhesive therebetween;
   a chip mounting step of mounting a plurality of semiconductor chips on the adhesive layer;
   a resin portion forming step of forming, on the adhesive layer, a resin portion containing the plurality of semiconductor chips by resin-sealing the plurality of semiconductor chips;
   a first supporting unit removing step of removing the first supporting unit in which the resin portion is formed on the adhesive layer, from the second supporting unit;
   a sheet stripping step of stripping the resin portion from the adhesive layer;
   an external connection member forming step of forming external connection members at the plurality of semiconductor chips contained in the resin portion; and
   a semiconductor package obtaining step of cutting portions between the respective semiconductor chips contained in the resin portion to obtain individual semiconductor packages,
   wherein there is no adhesive between the non-adhesive layer and the upper surface of the second supporting unit during an entire period of the first supporting unit placing step.

2. A semiconductor chip supporting carrier used in the semiconductor package fabricating method according to claim 1, comprising:
   the first supporting unit which is configured by attaching an adhesive sheet having the adhesive layer and the non-adhesive layer to a frame member; and
   the second supporting unit which supports the first supporting unit in a state of directing adhesive layer upward.

3. The semiconductor chip supporting carrier according to claim 2, wherein a suction path penetrating in a vertical direction is formed at a predetermined position of the second supporting unit contacting with the first supporting unit.

4. The semiconductor chip supporting carrier according to claim 2, wherein the second supporting unit is provided with a positioning unit for positioning the first supporting unit at a predetermined position on the second supporting unit.

5. A chip mounting device used in the semiconductor package fabricating method according to claim 1, comprising:
   a stage which holds a semiconductor chip supporting carrier that is configured by the first supporting unit and the second supporting unit, the first supporting unit being configured by attaching an adhesive sheet having the adhesive layer and the non-adhesive layer to a frame member, and the second supporting unit for supporting the first supporting unit in a state of directing the adhesive layer upward;
   a suction unit which sucks the first supporting unit and the second supporting unit held by the stage from underneath; and
   a mounting head which mounts semiconductor chips on the adhesive layer.

6. The chip mounting device according to claim 5, wherein in the stage, the second supporting unit is directly sucked and held via a suction path that opens in a top surface of the stage, and the first supporting unit is sucked and held via a suction path penetrating the second supporting unit in a vertical direction.

7. The chip mounting device according to claim 5, further comprising
   a reference mark recognition unit which recognizes a reference mark formed at the second supporting unit,
   wherein the semiconductor chips are mounted on the adhesive layer with reference to the reference mark recognized by the reference mark recognition unit.

8. The method according to claim 1, wherein
   the chip mounting step is performed with the second supporting unit on which the first supporting unit is placed being held on a stage of a chip mounting device, and
   in the stage, the second supporting unit is directly sucked and held via a suction path that opens in a top surface of the stage, and the first supporting unit is sucked and held via a suction path penetrating the second supporting unit in a vertical direction.

* * * * *